US009620641B2

(12) United States Patent
Cheng et al.

(10) Patent No.: US 9,620,641 B2
(45) Date of Patent: *Apr. 11, 2017

(54) FINFET WITH EPITAXIAL SOURCE AND DRAIN REGIONS AND DIELECTRIC ISOLATED CHANNEL REGION

(71) Applicant: INTERNATIONAL BUSINESS MACHINES CORPORATION, Armonk, NY (US)

(72) Inventors: Kangguo Cheng, Schenectady, NY (US); Ramachandra Divakaruni, Ossining, NY (US); Ali Khakifirooz, Los Altos, CA (US); Alexander Reznicek, Troy, NY (US); Soon-Cheon Seo, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/049,796

(22) Filed: Feb. 22, 2016

(65) Prior Publication Data

US 2016/0172498 A1 Jun. 16, 2016

Related U.S. Application Data

(63) Continuation of application No. 14/267,573, filed on May 1, 2014, now Pat. No. 9,312,360.

(51) Int. Cl.
*H01L 29/78* (2006.01)
*H01L 29/66* (2006.01)
(Continued)

(52) U.S. Cl.
CPC ...... *H01L 29/7848* (2013.01); *H01L 29/0638* (2013.01); *H01L 29/0649* (2013.01);
(Continued)

(58) Field of Classification Search
CPC .............. H01L 29/1083; H01L 29/165; H01L 29/6653; H01L 29/7848; H01L 29/785
See application file for complete search history.

(56) References Cited

U.S. PATENT DOCUMENTS 6,093,591 A 7/2000 Sawada
6,858,505 B2 2/2005 Park
(Continued)

OTHER PUBLICATIONS

List of IBM Patents or Patent Applications Treated as Related dated Feb. 22, 2016, 2 pages.

*Primary Examiner* — Eliseo Ramos Feliciano
*Assistant Examiner* — Ankush Singal
(74) *Attorney, Agent, or Firm* — Tutunjian & Bitetto, P.C.; Steven J. Meyers (57) ABSTRACT

A semiconductor device is provided that includes a pedestal of an insulating material present over at least one layer of a semiconductor material, and at least one fin structure in contact with the pedestal of the insulating material. Source and drain region structures are present on opposing sides of the at least one fin structure. At least one of the source and drain region structures includes at least two epitaxial material layers. A first epitaxial material layer is in contact with the at least one layer of semiconductor material. A second epitaxial material layer is in contact with the at least one fin structure. The first epitaxial material layer is separated from the at least one fin structure by the second epitaxial material layer. A gate structure present on the at least one fin structure.

10 Claims, 8 Drawing Sheets

(51) Int. Cl.
*H01L 29/10* (2006.01)
*H01L 29/165* (2006.01)
*H01L 29/06* (2006.01)
*H01L 29/08* (2006.01)
*H01L 29/16* (2006.01)
*H01L 29/161* (2006.01)

(52) U.S. Cl.
CPC ...... *H01L 29/0847* (2013.01); *H01L 29/1083* (2013.01); *H01L 29/161* (2013.01); *H01L 29/165* (2013.01); *H01L 29/1608* (2013.01); *H01L 29/6653* (2013.01); *H01L 29/66537* (2013.01); *H01L 29/66545* (2013.01); *H01L 29/66553* (2013.01); *H01L 29/66636* (2013.01); *H01L 29/66795* (2013.01); *H01L 29/785* (2013.01)

(56) References Cited

U.S. PATENT DOCUMENTS

| | | | |
|---|---|---|---|
| 6,977,400 B2 | 12/2005 | Puchner et al. | |
| 7,872,303 B2 * | 1/2011 | Chan | H01L 29/66795 |
| | | | 257/329 |
| 8,338,245 B2 | 12/2012 | Lee et al. | |
| 8,497,171 B1 | 7/2013 | Wu et al. | |
| 2003/0146494 A1 | 8/2003 | Puchner et al. | |
| 2005/0104096 A1* | 5/2005 | Lee | H01L 21/823842 |
| | | | 257/288 |
| 2009/0294800 A1* | 12/2009 | Cheng | H01L 21/823412 |
| | | | 257/192 |
| 2010/0038679 A1* | 2/2010 | Chan | H01L 29/66795 |
| | | | 257/190 |
| 2012/0299098 A1* | 11/2012 | Liu | H01L 29/42328 |
| | | | 257/347 |
| 2013/0049115 A1* | 2/2013 | Cheng | H01L 29/66803 |
| | | | 257/347 |
| 2013/0161639 A1 | 6/2013 | Pal et al. | |
| 2013/0320399 A1* | 12/2013 | Chang | H01L 29/7848 |
| | | | 257/190 |
| 2014/0061734 A1* | 3/2014 | Basker | H01L 29/66795 |
| | | | 257/288 |
| 2014/0295637 A1* | 10/2014 | Mehta | H01L 29/6653 |
| | | | 438/300 |
| 2015/0145064 A1* | 5/2015 | Ramachandran | H01L 29/785 |
| | | | 257/401 |
| 2015/0214364 A1* | 7/2015 | Chan | H01L 29/785 |
| | | | 257/190 |
| 2015/0221676 A1* | 8/2015 | Holt | H01L 29/66795 |
| | | | 257/347 |
| 2015/0228789 A1* | 8/2015 | Basker | H01L 29/7848 |
| | | | 257/401 |
| 2015/0263128 A1* | 9/2015 | Basker | H01L 29/6681 |
| | | | 257/288 |

* cited by examiner

FINFET WITH EPITAXIAL SOURCE AND DRAIN REGIONS AND DIELECTRIC ISOLATED CHANNEL REGION

BACKGROUND

Technical Field

The present disclosure relates to semiconductor devices, such as semiconductor devices including fin structures.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

In one aspect, a semiconductor device is provided that includes a pedestal of an insulating material present over at least one layer of a semiconductor material, and at least one fin structure in contact with the pedestal of the insulating material. Source and drain region structures are present on opposing sides of the at least one fin structure. At least one of the source and drain region structures includes at least two epitaxial material layers. A first epitaxial material layer of the at least two epitaxial layers is in contact with the at least one layer of semiconductor material. A second epitaxial material layer of the at least two epitaxial layers is in contact with the at least one fin structure. The first epitaxial material layer is separated from the at least one fin structure by the second epitaxial material layer. A gate structure present on the at least one fin structure.

In another aspect, a method of forming a semiconductor device is provided that includes providing at least one fin structure over a stacked structure of an insulator layer that is present over at least one semiconductor layer. A gate structure may then be formed on a channel region portion of the at least one fin structure. Exposed portions of the at least one fin structure can then be removed. A sacrificial spacer is formed on a sidewall of the gate structure. Exposed portions of the insulator layer may then be removed to provide a pedestal of insulating material exposing a portion of at least one semiconductor layer. A first epitaxial material layer may then be formed on the portion of the at least one semiconductor layer exposed by removing the exposed portions of the insulator layer. The first epitaxial material layer contacts the sacrificial spacer. The sacrificial spacer can then be removed. A second epitaxial material layer may then be formed in the space provided by removing the sacrificial spacer. The second epitaxial material layer contacts a sidewall of the at least one fin structure. The first and second epitaxial material layers provide source and drain regions on opposing sides of the channel region portion of the at least one fin structure.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on", and "over" mean that a first element, such as a first structure, is present on a second element, such as a second structure, wherein intervening elements, such as an interface structure, e.g. interface layer, may be present between the first element and the second element. The terms "direct contact" and "contacting" mean that a first element, such as a first structure, and a second element, such as a second structure, are connected without any intermediary conducting, insulating or semiconductor layers at the interface of the two elements. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A Fin Field Effect Transistor (FinFET) is a semiconductor device that positions the channel region of the semiconductor device in a fin structure.

In some embodiments, the methods and structures disclosed herein provide a FinFET semiconductor device having strained based performance enhancements. It has been determined that the appropriately applied strain can provide carrier speed enhancements in both FinFET on semiconductor on insulator (SOI) substrates or semiconductor devices including fin structures on local isolation. One way to strain the channel region of the FinFET is by growing strain inducing epitaxial material in the source region and drain region of the FinFET, in which the epitaxial material being grown has different lattice dimensions than the deposition surface that the epitaxial material is formed on. For example, silicon germanium (SiGe) that is epitaxially grown on a silicon (Si) deposition surface produces a compressive stress that when induced on the channel region of a p-type conductivity FinFET increases hole carrier speed, and silicon doped with carbon (Si:C) that is epitaxially grown on a silicon (Si) deposition surface produces a tensile stress that when induced on the channel region of an n-type conductivity FinFET increases electron carrier speed. The term "epitaxial material" denotes a semiconductor material that has been formed using an epitaxial growth and/or epitaxial deposition process. "Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface will take on a {100} orientation. The epitaxial deposition process may be carried out in the deposition chamber of a chemical vapor deposition (CVD) apparatus.

It has been determined that growing epitaxial semiconductor material along a dielectric surface, such as an oxide surface, as well as having two epitaxy growth fronts, e.g., one from the surface of a base substrate and one from the sidewall surface of a fin structure, can lead to the creation of crystal defects in the epitaxial material. Crystal defect that are proximate to the channel region of a semiconductor device, such as a FinFET, have a negative impact on reliability. Therefore, it is desired to improve the FinFET structure and FinFET performance by employing strain inducing material, such as epitaxially grown source and drain structures, without producing defects at the interface of source and drain regions and the channel region of the device.

In some embodiments, the methods and structures disclosed herein provide strain inducing source and drain region structures composed of epitaxially formed material, while eliminating the incidence of defects at the interface of the source and drain regions and the channel region of the semiconductor device. For example, in some embodiments, the methods and structures provided herein can move the site of potential defect formation that can occur during the epitaxial growth process for forming source and drain regions of strain inducing epitaxial materials away from the channel region of the device. The methods and structures of the present disclosure are now discussed with more detail referring to FIGS. 1-8B.

Figure 1A:
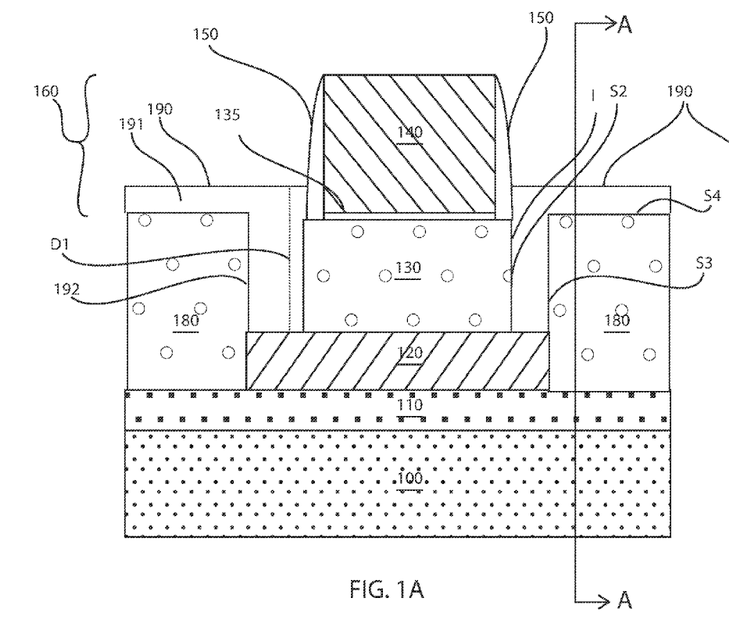
FIG. 1A is a side cross-sectional view along a length of a fin structure, i.e., parallel to the length of the fin structure, depicting one embodiment of a FinFET semiconductor device including source and drain region structures composed of at least two epitaxial material layers, in accordance with one embodiment of the present disclosure.
Figure 1B:
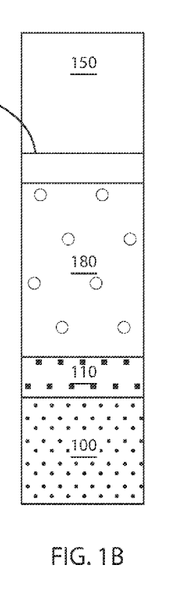
FIG. 1B is a side cross-sectional view perpendicular to the length of the fin structure depicted in FIG. 1A along section line A-A.

FIGS. 1A and 1B depict one embodiment of a FinFET semiconductor device including a pedestal of an insulating material 120 that is present over at least one layer of a semiconductor material 100, 110, wherein at least one fin structure 130 of the FinFET semiconductor device is in contact with the pedestal of the insulating material 120. In some embodiments, the at least one layer of the semiconductor material 100, 110 may include a punch-through stopper layer 110 and a semiconductor substrate 100. A gate structure 140 is present on the at least one fin structure 130. The at least one fin structure 130 provides the channel region of the FinFET semiconductor device. The gate structure 140 typically includes at least one gate dielectric 135 that is present on the channel region of the FinFET, and at least one gate conductor 140 that is present on the at least one gate dielectric 135. A gate sidewall spacer 150 may be present on the sidewall of the gate structure 140. As used herein, the term "channel" is the region underlying the gate structure and between the source and drain regions of a semiconductor device that becomes conductive when the semiconductor device is turned on. As used herein, the term "drain region" means a doped region in semiconductor device located at the end of the channel region, in which carriers are flowing out of the semiconductor device through the drain region. The term "source region" is a doped region in the semiconductor device, in which majority carriers are flowing into the channel region.

In some embodiments, the source and drain region structures of the FinFET that is provided by the methods and structures disclosed herein are composed of least two epitaxial material layers 180, 190. To provide strain inducing structures, the material of the at least two epitaxial material layers 180, 190 is selected to have a different lattice dimension than the lattice dimension of the deposition surfaces, e.g., the at least one layer of a semiconductor material 100, 110. For example, when the punch-through stopper layer 110 is composed of silicon (Si), and the semiconductor device is an n-type conductivity FinFET, the at least two epitaxial material layers 180, 190 may be composed of silicon doped with carbon (Si:C). The smaller lattice dimension of the silicon doped with carbon (Si:C) relative to the silicon (Si) punch through stopper layer 110 induces a tensile strain on the channel region portion of the devices that increases the speed of electron charge carriers, which increases the switching speed of the n-type conductivity FinFET. In another example, when the punch-through stopper layer 110 is composed of silicon (Si), and the semiconductor device is a p-type conductivity FinFET, the at least two epitaxial material layers 180, 190 may be composed of silicon germanium (SiGe). The larger lattice dimension of the silicon germanium (SiGe) relative to the silicon (Si) punch-through stopper layer 110 induces a compressive strain on the channel region portion of the devices that increases the speed of hole charge carriers, which increases the switching speed of the p-type conductivity FinFET.

The interface I between the source and drain region structures of the FinFET and the channel region portion of the FinFET that is provided by the disclosed methods and structures is substantially free of defects, such as point defects, voids, stacking faults, line defects and dislocation defects. By "substantially free" of defects it is meant that the maximum amount of defects at the interface between the source and drain region structures and the channel region portion of the FinFET is 10000 defects/cm$^2$ or less. In one example, the maximum amount of defects that is provided by the methods and structures disclosed herein at the interface I between the source and drain region structures and the channel region portion of the FinFET is 1000 defects/cm$^2$ or less. In yet another example, the number of defects at the interface I between the source and drain region structures and the channel region portion of the FinFET is 0.

In some embodiments, the at least two epitaxial semiconductor material layers 180, 190, include a first epitaxial material layer 180 and a second epitaxial material layer 190. The first epitaxial material layer 180 is epitaxially formed from the upper surface of the at least one layer of the semiconductor material 100, 110, e.g., the punch-through stopper layer 110. The second epitaxial semiconductor layer 190 of the at least two epitaxial semiconductor material layers is formed separately, e.g., after, the first epitaxial material layer 180, and is epitaxially formed from at least the sidewall S2 of the at least one fin structure 130, as well as the exposed surfaces S3, S4 of the first epitaxial material layer 180. The first epitaxial material layer 180 is separated from the at least one fin structure 130 by the second epitaxial material layer 190. In some embodiments, because the second epitaxial semiconductor material 190 is formed from the exposed sidewall S2 of the at least one fin structure 130, the epitaxial growth for the second epitaxial semiconductor material 190 at the channel region interface I is lateral and free of contacting dielectric surfaces. The epitaxial growth at the channel interface region I only results from one epitaxial growth front, i.e., the sidewall S2 of the fin structure 130, which ensures that the epitaxial material that is formed at the interface I with the channel region of the device is substantially free of defects. In some embodiments, the second epitaxial semiconductor material 190 may have a vertical portion 192 that is in direct contact with the sidewall S2 of the channel region portion of the at least one fin structure 130, and may have a horizontal portion 191 on an upper surface S4 of the first epitaxial material layer 180. Because the second epitaxial semiconductor material 190 is formed using an epitaxial growth and/or epitaxial deposition process, the vertical portion 192 of the second epitaxial material layer 190 has a crystalline structure that is aligned with a crystal structure of the sidewall S2 of the at least one fin structure 130, and the horizontal portion 191 of the second epitaxial material layer 190 has a crystalline structure that is aligned to the crystal structure of the upper surface S4 of the first epitaxial material layer 180.

It is noted that in some embodiments, because the epitaxial material of the second epitaxial material layer 190 is being simultaneously laterally grown from the surfaces of the sidewall S2 of the at least one fin structure 130 and the sidewall S3 of the first epitaxial material layer 180, a defect region D1 may form in a central region of the vertical portion 192 of the second epitaxial material layer 190. The defect region D1 may form due to the epitaxial growth from two growth fronts, i.e., the sidewall S2 of the at least one fin structure 130 and the sidewall S3 of the first epitaxial material layer 180. In one example, the defect region D1 may have a defect density that is greater than 10,000 defects/cm$^2$. In another example, the concentration of defects that may occur at the defect region D1 may range from 10,000 defects/cm$^2$ to 500,000 defects/cm$^2$. It is noted that the defect region D1 is separated from the channel region of the FinFET, which begins at the sidewall S2 of the at least one fin structure 130. For example, the defect region D1 may be separated from the channel region of the FinFET by a dimension ranging from 2 nm to 20 nm. Therefore, because the defect region D1 is separated from the channel region of the FinFET, the defect region D1 does not impact the performance and reliability of the device. The structures depicted in FIGS. 1A and 1B, as well as one embodiment of a method for forming the FinFET that is depicted in FIGS. 1A and 1B are now described in detail with reference to FIGS. 2A-8B.

Figure 2A:
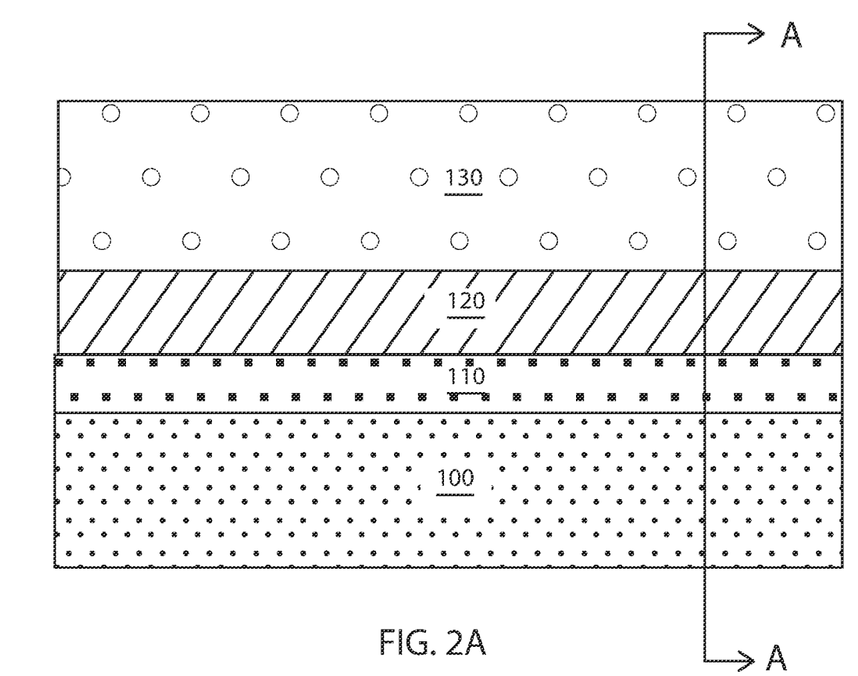
FIG. 2A is a side cross-sectional view of at least one fin structure along a length of the fin structure, wherein the fin structure is formed over a stacked structure of an insulator layer that is present over at least one semiconductor layer, as used to form a finFET semiconductor device, in accordance with one embodiment of the present disclosure.
Figure 2B:
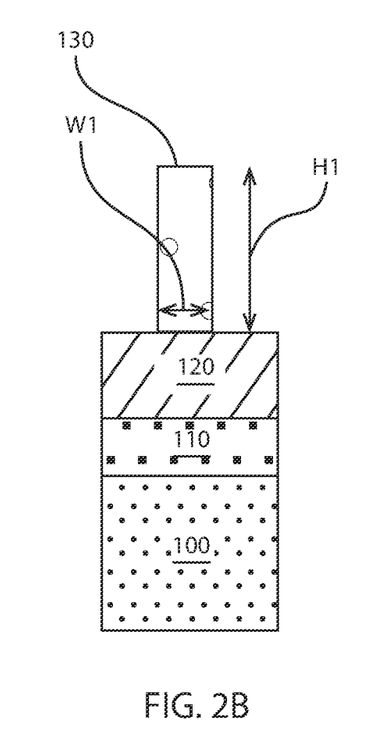
FIG. 2B is a side cross-sectional view perpendicular to the length of the fin structure depicted in FIG. 2A along section line A-A.

FIGS. 2A and 2B depict one embodiment of a stacked structure of at least one fin structure 130 that is present on an insulator layer 120, wherein the insulator layer 120 is present over at least one semiconductor layer 100, 110. The at least one semiconductor layer 100, 110 may include a punch-through stopper layer 110 that is present on the upper surface of a semiconductor substrate 100. In some embodiments, the semiconductor substrate 100 may have a single crystal, i.e., monocrystalline, crystal structure. In some embodiments, the semiconductor substrate 100 is composed of a silicon including material. In some embodiments, the silicon including material that provides the semiconductor substrate 100 may include, but is not limited to silicon, single crystal silicon, multicrystalline silicon, polycrystalline silicon, amorphous silicon, strained silicon, silicon doped with carbon (Si:C), silicon alloys or any combination thereof. In other embodiments, the semiconductor substrate 100 may be a semiconducting material that may include, but is not limited to, germanium (Ge), silicon germanium (SiGe), silicon germanium doped with carbon (SiGe:C), germanium alloys, GaAs, InAs, InP as well as other III/V and II/VI compound semiconductors.

The punch through stopper layer 110 is typically composed of a semiconductor material. The semiconductor material that provides the punch through stopper layer 110 may be any of the semiconductor materials that have been described above for the semiconductor substrate 100. Typically, the punch through stopper layer 110 is a doped layer that has a conductivity type that is opposite the conductivity type of the later formed source and drain regions. For example, when the later formed source and drain region are doped to an n-type conductivity to provide an n-type FinFET, the punch through stopper layer 110 is doped to a p-type conductivity. In another example, when the later formed source and drain region are doped to a p-type conductivity to provide a p-type FinFET, the punch through stopper layer 110 is doped to an n-type conductivity. Typically, by forming a semiconductor layer having an opposite conductivity than the source and drain regions, the punch-through stopper layer 110 reduces leakage current and short-channel effects in the device. In some embodiments, the punch-through stopper layer 110 is a material layer that is deposited onto the semiconductor substrate 100. In other embodiments, the punch-through stopper layer 110 may be formed within the upper surface of the semiconductor substrate 100 using ion implantation or in-situ doped epitaxial growth. In some embodiments, the punch-through stopper layer 110 may be omitted.

The insulator layer 120 that is present on the at least one semiconductor layer 100, 110 may be a dielectric material, such as an oxide, nitride, oxynitride, high-k dielectric, low-k dielectric, or any suitable combination of those materials. For example, when the insulator layer 120 is an oxide, the insulator layer 120 may be composed of silicon oxide. In another example, when the insulator layer 120 is a nitride, the insulator layer 120 may be composed of silicon nitride. The insulator layer 120 may be deposited on the upper surface of the at least one semiconductor layer 100, 110 using a chemical vapor deposition (CVD) process, such as plasma enhanced chemical vapor deposition (PECVD), metal organic chemical vapor deposition (MOCVD), high density plasma chemical vapor deposition (HDPCVD) or a combination thereof. The insulator layer 120 may also be formed using a thermal growth method, such as thermal oxidation. In yet another embodiment, the insulator layer 120 may be a portion of an semiconductor on insulator (SOI) substrate, in which insulator layer 120 may be formed by implanting a high-energy dopant into a bulk semiconductor substrate and then annealing the structure to form a buried insulating layer. In this example, the semiconductor substrate 100 would provide the base substrate of the SOI substrate, and the material layer that provides the at least one fin structure 130 would provide the semiconductor on insulator (SOI) layer of the SOI substrate. In one example, the thickness of the insulator layer 120 may range from 10 nm to about 200 nm.

The at least one fin structure 130 may be formed on the upper surface of the insulator layer 120. In some embodiments, the at least one fin structure 130 may be formed from the SOI layer of an SOI substrate, in which the insulator layer 120 would be provided by the buried dielectric layer of the SOI substrate. In other embodiments, the at least one fin structure 130 may be formed from a semiconductor material layer that is deposited, e.g., deposited by chemical vapor deposition (CVD), on the insulator layer 120. In other examples, the semiconductor material layer that provides the at least one fin structure 130 may be transferred to the insulator layer 120 using layer transfer and bonding methods. In other examples, the semiconductor material layer that provides the at least one fin structure 130 may be formed by other known techniques, such as starting with a bulk semiconductor substrate, undercutting the material underneath the semiconductor layer that provides the at least on fin structure, and then backfilling the undercut portion with one or more dielectric materials. Some examples of semiconductor materials that are suitable for providing the at least one fin structure 130 may include silicon, single crystal silicon, multicrystalline silicon, polycrystalline silicon, amorphous silicon, strained silicon, silicon doped with carbon (Si:C), silicon alloys or any combination thereof. In other embodiments, the material for the at least one fin structure 130 may be a semiconducting material that may include, but is not limited to, germanium (Ge), silicon germanium (SiGe), silicon germanium doped with carbon (SiGe:C), germanium alloys, GaAs, InAs, InP, as well as other III/V and II/VI compound semiconductors. In other embodiments, the material for the at least one fin structure 130 may be strained. In other embodiments, the material for the at least one fin structure 130 may have multiple regions. Each region includes at least one fin structure. Those regions may have the same or different materials and/or strain. Following formation of the material for the at least one fin structure 130, the geometry and dimensions of the fin structures 130 may be defined using etch processing. For example, the at least one fin structure 130 may be formed using sidewall image transfer (SIT) methods. More specifically, in one example of a SIT method, a sacrificial mandrel is first formed on a surface of the material layer for forming the at least one fin structure 130. The sacrificial mandrel may be formed using deposition, patterning and development processes. Thereafter, a deposition such as chemical vapor deposition provides a dielectric profile on the sidewalls of the sacrificial mandrel. The sacrificial mandrel may then be removed. For example, sacrificial mandrel can be removed using a chemical strip or selective etching. In some examples, the sacrificial mandrel is amorphous carbon. In some examples, the sacrificial is amorphous silicon. Following removal of the sacrificial mandrel, the dielectric profile remains to provide an etch mask. The material layer for the at least one fin structure 130 is then etched using the dielectric profile as an etch mask to define the geometry and dimensions of the least one fin structures 130. The etch process for forming the at least one fin structure 130 may be an anisotropic etch, such as reactive ion etching (RIE).

Referring to FIG. 2B, each of the fin structures 130 may have a height $H_1$ ranging from 15 nm to 500 nm. In another embodiment, each of the fin structures 130 has a height $H_1$ ranging from 30 nm to 100 nm. In one example, each of the fin structures 130 has a height $H_1$ ranging from 30 nm to 60 nm. Each of the fin structures 130 may have a width $W_1$ of less than 20 nm. In another embodiment, each of the fin structures 130 has a width $W_1$ ranging from 5 nm to 10 nm. Although only one fin structure is depicted in FIG. 2B, the present disclosure is not limited to only this example. It is noted that any number of fin structures 130 may be present on the insulator layer 120. The pitch, i.e., center of fin structure to center of adjacent fin structure distance, separating adjacent fin structures may range from 10 nm to 500 nm. In another example, the pitch separating adjacent fin structures may range from 20 nm to 50 nm.

Figure 3A:
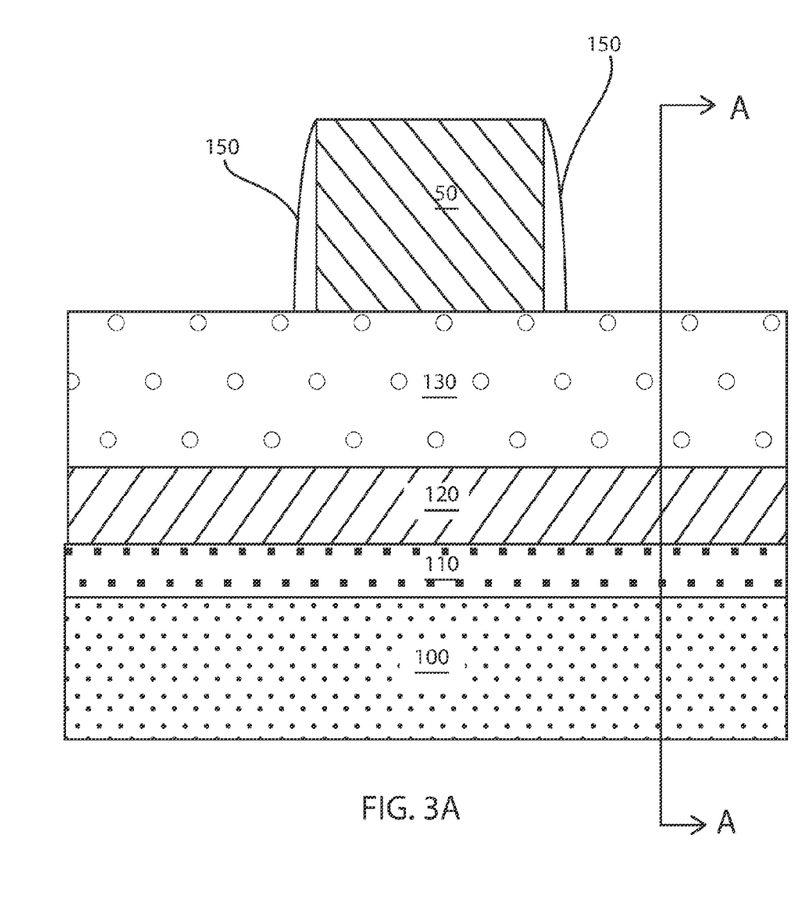
FIG. 3A is a side cross-sectional view along a length of the fin structure depicting forming a sacrificial gate structure on the channel region portion of the at least one fin structure that is depicted in FIG. 2A.
Figure 3B:
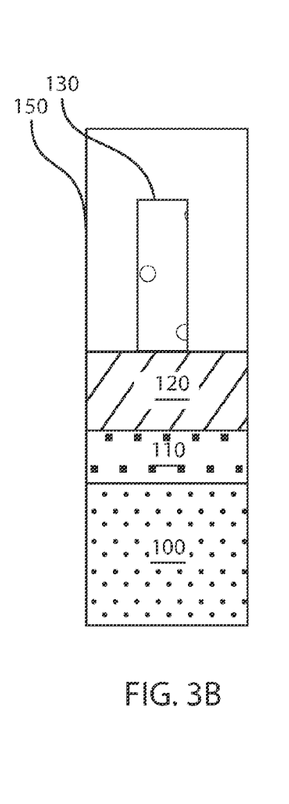
FIG. 3B is a side cross-sectional view perpendicular to the length of the fin structure depicted in FIG. 3A along section line A-A.

FIGS. 3A and 3B depict one embodiment of forming a gate structure 50 on the channel region portion of the at least one fin structure 130 that is depicted in FIG. 2A. By "sacrificial" it is meant that the structure is present during processing of the semiconductor device, but is removed from the semiconductor device prior to the device being completed. In the present process flow, a sacrificial gate structure 50 is employed as part of a replacement gate process. As used herein, the term "sacrificial gate structure" denotes a sacrificial structure that dictates the geometry and location of the later formed functioning gate structure 160. The "functional gate structure" operates to switch the semiconductor device from an "on" to "off" state, and vice versa.

In one embodiment, the sacrificial material that provides the sacrificial gate structure 50 may be composed of any material that can be etched selectively to the at least one fin structure 130. In one embodiment, the sacrificial gate structure 50 may be composed of a silicon-including material, such as polysilicon. In another embodiment, the sacrificial gate structure 50 may be composed of a dielectric material, such as an oxide, nitride or oxynitride material, or amorphous carbon. The sacrificial gate structure 50 may be formed using deposition (e.g., chemical vapor deposition) photolithography and etch processes (e.g., reactive ion etching) to provide the sacrificial gate structure 50.

FIGS. 3A and 3B also depicts forming a gate sidewall spacer 150 on the sidewall of the sacrificial gate structure 50. The gate sidewall spacer 150 is typically composed of a dielectric material, such as an oxide, nitride, oxynitride, or other dielectric materials, such as high-k or low-k materials. For example, when the gate sidewall spacer 150 is composed of an oxide, the gate sidewall spacer 150 may be composed of silicon oxide ($SiO_2$). In another example, when the gate sidewall spacer 150 is composed of a nitride, the gate sidewall spacer 150 may be composed of silicon nitride. Yet in another example, when the gate sidewall spacer 150 is composed of a low-k material, the gate sidewall spacer 150 may be composed of SiBCN. It is noted that the aforementioned compositions for the gate sidewall spacer 150 are provided for illustrative purposes only, and are not intended to limit the present disclosure. In some embodiments, other material compositions are equally suitable for the gate sidewall spacer 150, so long as the later described sacrificial spacer can be removed selectively without removing the gate sidewall spacer 150. The gate sidewall spacer 150 may be formed using a deposition process, such as chemical vapor deposition (CVD), and an anisotropic etchback method.

Figure 4A:
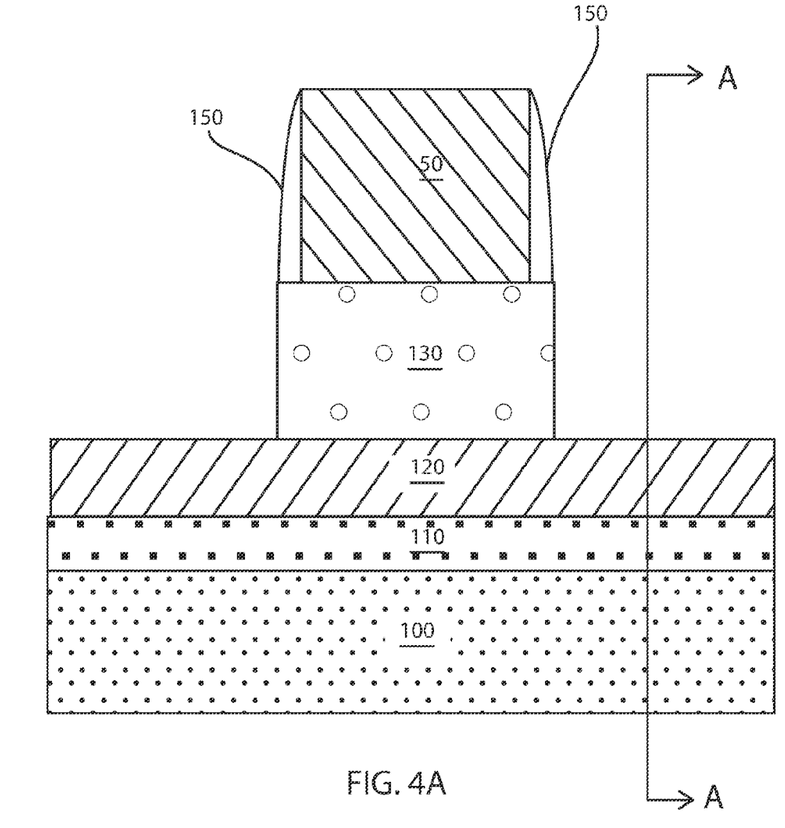
FIG. 4A is a side cross-sectional view along a length of the fin structure depicting removing the exposed portions of the at least one fin structure depicted in FIG. 3A, in accordance with one embodiment of the present disclosure.
Figure 4B:
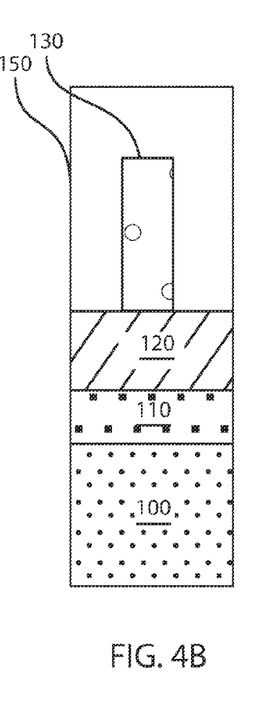
FIG. 4B is a side cross-sectional view perpendicular to the length of the fin structure depicted in FIG. 4A along section line A-A.

FIGS. 4A and 4B depict one embodiment of removing the exposed portions of the at least one fin structure 130 that is not covered by the sacrificial gate structure 50 and the gate sidewall spacer 150. The exposed portions of the at least one fin structure 130 that are removed may be removed by an etch process that removes the material of the least one fin structure 130 selectively to at least one of the sacrificial gate structure 50, the gate sidewall spacer 150, and the insulator layer 120. The term "selective" as used to describe a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater. The etch process for removing the exposed portions of the at least one fin structure 130 may be an anisotropic etch. As used herein, an "anisotropic etch process" denotes a material removal process in which the etch rate in the direction normal to the surface to be etched is greater than in the direction parallel to the surface to be etched. One form of anisotropic etching that is suitable for etching the exposed portions of the at least one fin structure 130 is reactive ion etching. Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present disclosure include ion beam etching, plasma etching or laser ablation. The etch process exposes the portions of the dielectric layer 120 that are on opposing sides of the sacrificial gate structure 50. In some embodiments, end point detection may be employed to determine when to terminate the etch process, or the etch process may be timed.

Figure 5A:
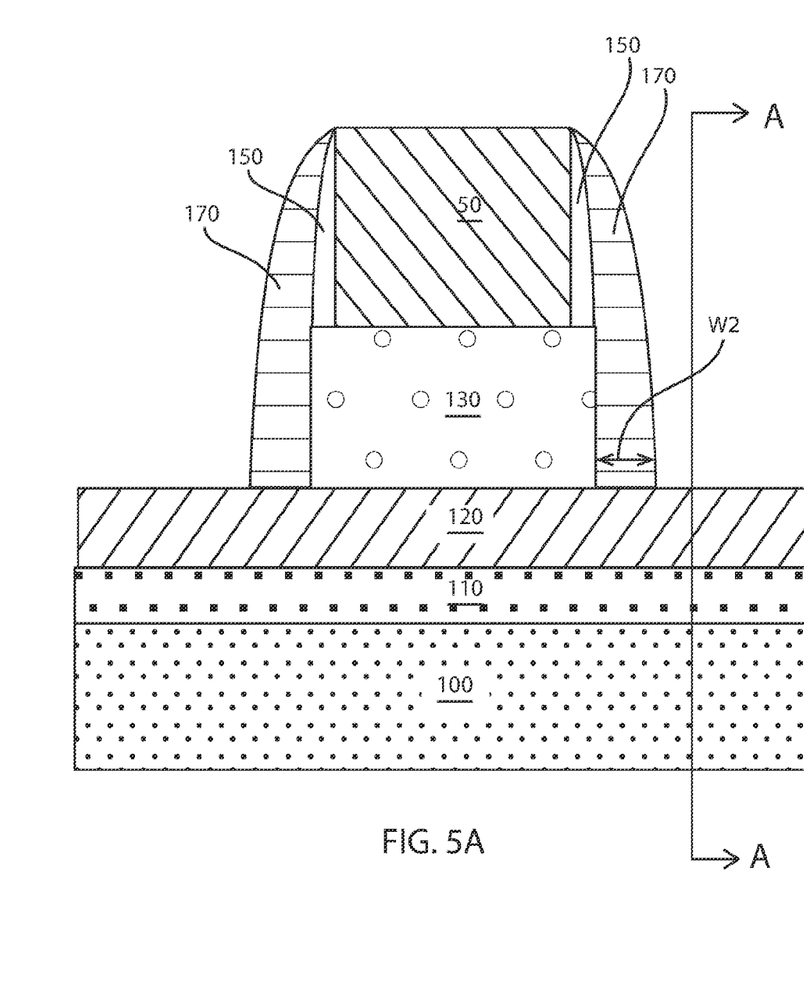
FIG. 5A is a side cross-sectional view along a length of the fin structure depicting forming a sacrificial spacer on a sidewall of the sacrificial gate structure that is depicted in FIG. 3A, in accordance with one embodiment of the present disclosure.
Figure 5B:
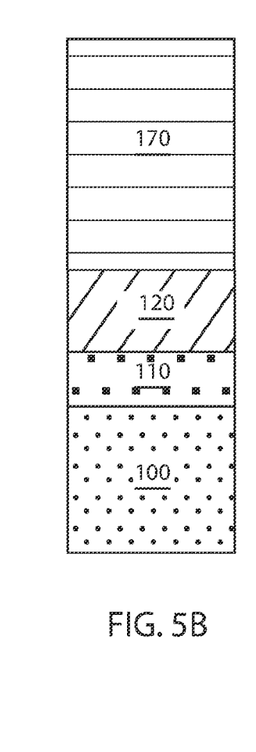
FIG. 5B is a side cross-sectional view perpendicular to the length of the fin structure depicted in FIG. 5A along section line A-A.

FIGS. 5A and 5B depict one embodiment of forming a sacrificial spacer 170 on a sidewall of the sacrificial gate structure 50, as well as the exposed sidewall of the remaining portion of the at least one fin structure 130. Typically, the sacrificial spacer 170 is formed in direct contact with the outer surface of the gate sidewall spacer 150. The sacrificial spacer 170 has a base portion that is in direct contact with a portion of the insulator layer 120. The width W2 of the base portion of the sacrificial spacer 170 may range from 3 nm to 30 nm. In another embodiment, the width W2 of the base portion of the sacrificial spacer 170 may range from 5 nm to 15 nm. The width of sacrificial spacer 170 may taper towards the upper surface of the sacrificial gate structure 50. The sacrificial spacer 170 may be composed of a dielectric, such as an oxide, nitride, or oxynitride material. The sacrificial spacer 170 is typically composed of a dielectric material that can be removed, i.e., etched, selectively to the gate sidewall spacer 150. For example, when the gate sidewall spacer 150 is composed of an oxide, such as silicon oxide, the sacrificial spacer 170 may be composed of a nitride, such as silicon nitride. It is noted that the aforementioned compositions for the sacrificial 170 are provided for illustrative purposes only, and are not intended to limit the present disclosure. In some embodiments, other material compositions are equally suitable for the sacrificial spacer 170, so long as the material of the sacrificial spacer 170 can be removed selectively without removing the underlying gate sidewall spacer 150. The sacrificial spacer 170 may be formed using a deposition process, such as chemical vapor deposition (CVD), and an anisotropic etchback method.

Figure 6A:
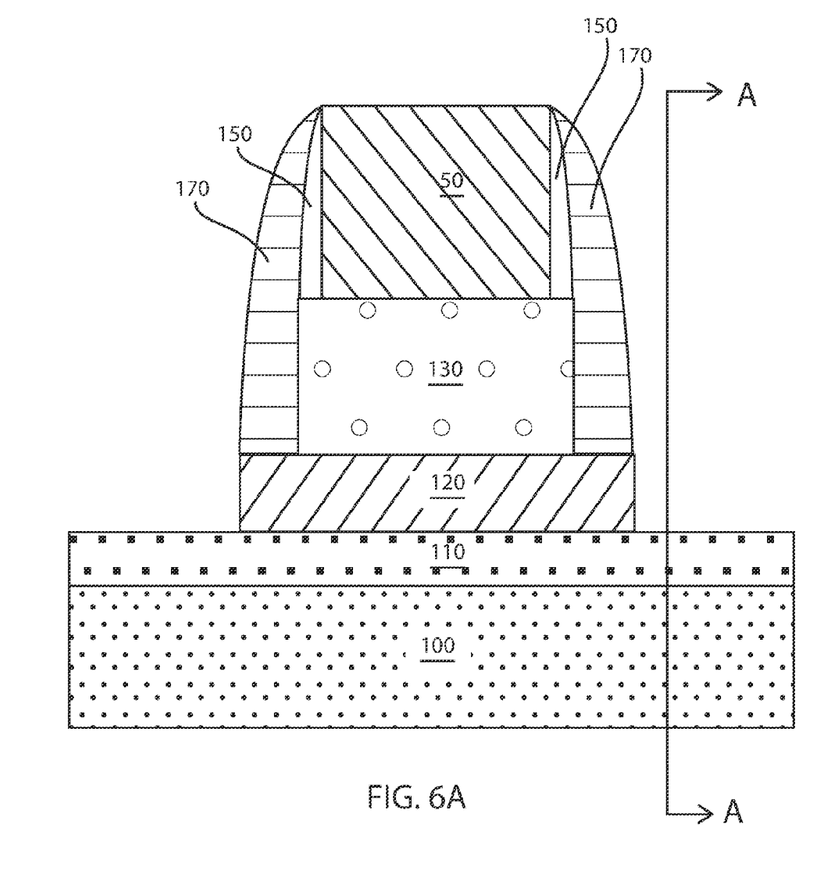
FIG. 6A is a side cross-sectional view along a length of the fin structure depicting removing exposed portions of the insulator layer to provide a pedestal of insulating material exposing a portion of at least one semiconductor layer, in accordance with one embodiment of the present disclosure.
Figure 6B:
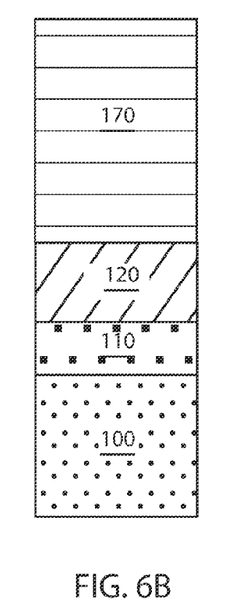
FIG. 6B is a side cross-sectional view perpendicular to the length of the fin structure depicted in FIG. 6A along section line A-A.

FIGS. 6A and 6B depict removing exposed portions of the insulator layer 120 to provide a pedestal of insulating material exposing a portion of at least one semiconductor layer 100, 110, e.g., exposing the punch-through stopper layer 110. The exposed portions of the insulator layer 120 may be removed by an etch process that removes the material of the insulator layer 120 selectively to at least one of the sacrificial gate structure 50, the sacrificial spacer 170, and the at least one semiconductor layer 100, 110, e.g., the punch-through stopper layer 110. The etch process for removing the exposed portions of the insulator layer 120 may be an anisotropic etch, such as reactive ion etch (RIE), ion beam etching, plasma etching or laser ablation. The etch process exposes the portions of the at least one semiconductor layer 100, 110, e.g., exposes portions of the punch-through stopper layer 110, that are on opposing sides of the sacrificial gate structure 50. In some embodiments, end point detection may be employed to determine when to terminate the etch process, or the etch process may be timed.

Figure 7A:
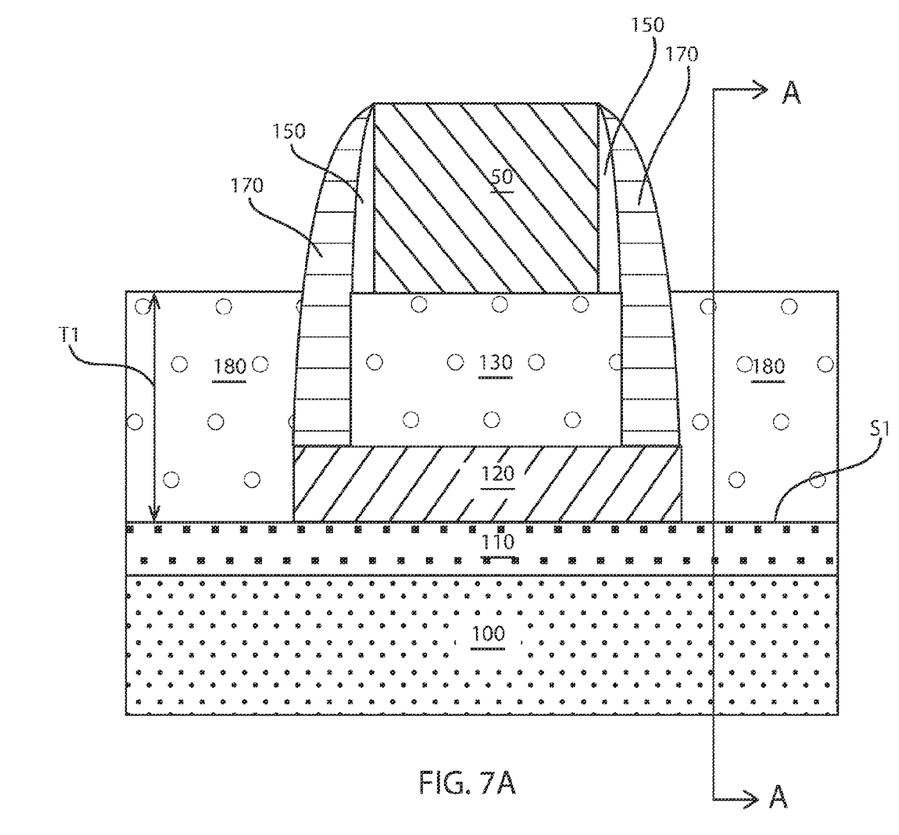
FIG. 7A is a side cross-sectional view along a length of the fin structure depicting forming a first epitaxial material layer on the portion of the at least one semiconductor layer exposed by removing the exposed portions of the insulator layer, as depicted in FIG. 6A, in accordance with one embodiment of the present disclosure.
Figure 7B:
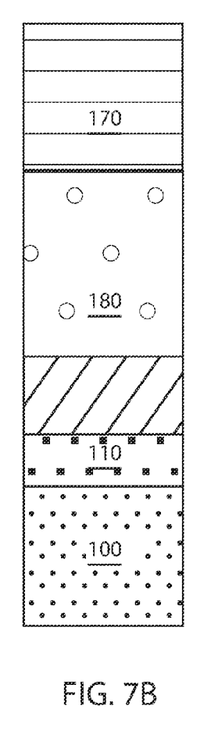
FIG. 7B is a side cross-sectional view perpendicular to the length of the fin structure depicted in FIG. 7A along section line A-A.

FIGS. 7A and 7B depict forming a first epitaxial material layer 180 on the portion of the at least one semiconductor layer 100, 110, e.g., on the punch-through stopper layer 110, that is exposed by removing the exposed portions of the insulator layer 120. The first epitaxial material layer 180 is one of the material layers that provides the source and drain regions of the FinFET. As described above, the first epitaxial material layer 180 is formed using an epitaxial deposition (also referred to as an epitaxial growth process), in which the first epitaxial material layer 180 is epitaxially grown from a surface of the at least one semiconductor layer 100, 110, e.g., the exposed upper surface S1 of the punch-through stopper layer 110. The first epitaxial material layer 180 grows upward from the upper surface Si of the at least one semiconductor layer 100, 100, and may grow into contact with, e.g., abut, the outer sidewall of the sacrificial spacer 170. The epitaxial deposition process for forming the first epitaxial material layer 180 may be a selective deposition process. For example, although the epitaxially deposited material orientates to the crystal arrangement of a semiconductor material and is deposited thereon, the epitaxial semiconductor material may not be grown on a dielectric material, such as the sacrificial spacer 17, as well as a gate dielectric cap (not shown) that is present atop the sacrificial gate structure 50.

The thickness T1 of the first epitaxial material layer 180 may range from 25 nm to 500 nm. In another embodiment, the thickness T1 of the first epitaxial material layer 180 may range from 30 nm to 100 nm. In yet another embodiment, the thickness T1 of the first epitaxial material layer 180 may range from 30 nm to 60 nm.

The material of the first epitaxial material 180 may be selected depending upon the conductivity type of the FinFET device being formed. For example, when the FinFET device has an n-type conductivity, i.e., the source and drain structures are doped to an n-type conductivity, the material of the first epitaxial material layer 180 may be selected to induce a tensile strain on the channel region of the device. For example, to induce a tensile strain in the at least one fin structure 130, when the exposed upper surface Si of the punch-through stopper layer 110 is composed of silicon (Si), the material that is selected for the first epitaxial material layer 180 may be silicon doped with carbon (Si:C). For example, when the FinFET device has a p-type conductivity, i.e., the source and drain structures are doped to a p-type conductivity, the material of the first epitaxial material layer 180 may be selected to induce a compressive strain on the channel region of the device. For example, to induce a compressive strain in the at least one fin structure 130, when the exposed upper surface S1 of the punch-through stopper layer 110 is composed of silicon (Si), the material that is selected for the first epitaxial material layer 180 may be silicon germanium (SiGe). It is noted that the above material compositions for the first epitaxial material layer 180 have been provided for illustrative purposes only, and are not intended to limit the present disclosure. For example, the material for the at first epitaxial material layer 180 may also be composed of silicon (Si) and/or silicon germanium doped with carbon (SiGe:C), as well as other semiconductor materials.

A number of different sources may be used for the deposition of the semiconductor material that forms the first epitaxial material layer 180. In some embodiments, in which the semiconductor material that forms the first epitaxial material layer 180 is composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In some embodiments, in which the semiconductor material that forms the first epitaxial material layer 180 is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof. When the first epitaxial material layer 180 is composed of silicon doped with carbon, a carbon source may be added to deposition chamber with the above described silicon sources. Carbon sources, i.e., carbon containing precursors, which are useful to deposit silicon containing compounds include organosilanes, alkyls, alkenes and alkynes of ethyl, propyl and butyl. Such carbon sources include methylsilane ($CH_3SiH_3$), dimethylsilane (($CH_3$)$_2SiH_2$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), as well as others. The carbon (C) content of the epitaxial grown silicon doped with carbon (Si:C) may range from 0.3% to 5%, by atomic weight %. In another embodiment, the carbon content of the epitaxial grown silicon doped with carbon (Si:C) may range from 1% to 2%. It is noted that the above examples of source gasses for deposition of epitaxial material are provided for illustrative purposes only, and are not intended to be limitation. Other deposition source gasses may be equally suitable for use with the present disclosure.

The first epitaxial material layer 180 may be doped with an n-type or p-type dopant to provide the conductivity type of the source and drain regions of the FinFET. The first epitaxial material layer 180 may be in-situ doped. By "in-situ" it is meant that the dopant that dictates the conductivity type, i.e., n-type or p-type, of the source and drain regions is introduced during the process step that forms the material layer for the source and drain regions, e.g., first epitaxial material layer 180. An in-situ doped first epitaxial material layer 180 having a p-type conductivity may be produced in a type IV semiconductor, such as a silicon including semiconductor or a germanium including semiconductor, by doping the type IV semiconductor material with group III-A elements of the periodic table of elements, such as boron (B). An in situ doped first epitaxial material layer 180 having an n-type conductivity may be produced in a type IV semiconductor, such as a silicon including semiconductor or a germanium including semiconductor, by doping the type IV semiconductor material with group V elements of the periodic table of elements, such as phosphorus (P) or arsenic (As). In some embodiments, uniform concentration of n-type or p-type dopant that is present in the in-situ doped first epitaxial material layer 180 may range from $1 \times 10^{14}$ atoms/cm$^3$ to $2 \times 10^{21}$ atoms/cm$^3$. In another embodiment, the concentration of n-type or p-type dopant that is present in the in-situ doped first epitaxial material layer 180 may range from $1\times10^{19}$ atoms/cm$^3$ to $1\times10^{21}$ atoms/cm$^3$.

In one embodiment, the n-type gas dopant source for introducing the in-situ dopant to the first epitaxial material layer 180 may include arsine (AsH$_3$), phosphine (PH$_3$) and alkylphosphines, such as with the empirical formula R$_x$PH$_{(3-x)}$, where R=methyl, ethyl, propyl or butyl and x=1, 2 or 3. Alkylphosphines suitable for use with the present disclosure include trimethylphosphine ((CH$_3$)$_3$P), dimethylphosphine ((CH$_3$)$_2$PH), triethylphosphine ((CH$_3$CH$_2$)$_3$P) and diethylphosphine ((CH$_3$CH$_2$)$_2$PH). In one embodiment, the p-type gas dopant source for introducing the in-situ dopant to the first epitaxial material layer 180 may include diborane (B$_2$H$_6$).

Figure 8A:
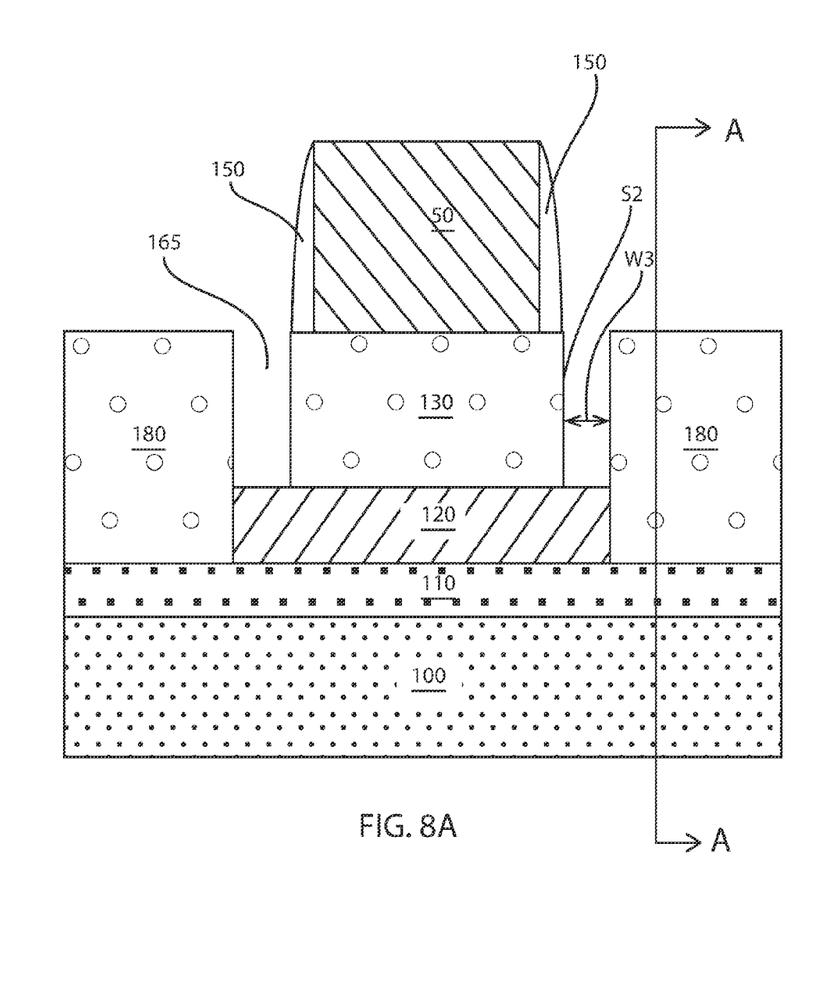
FIG. 8A is a side cross-sectional view along a length of the fin structure depicting removing the sacrificial spacer, in accordance with one embodiment of the present disclosure.
Figure 8B:
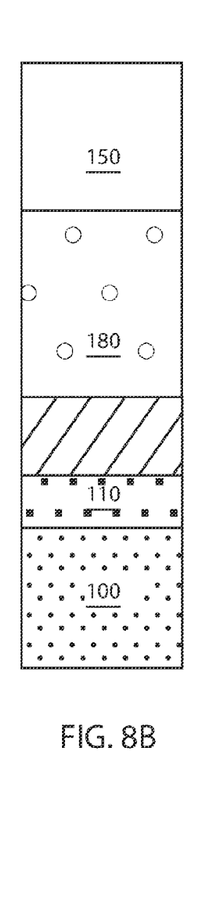
FIG. 8B is a side cross-sectional view perpendicular to the length of the fin structure depicted in FIG. 8A along section line A-A.

FIGS. 8A and 8B depict one embodiment of removing the sacrificial spacer 170. Removing the sacrificial spacer 170 provides an opening 165 that exposes the sidewall S2 of the remaining portion of the at least one fin structure 130 that provides the channel portion of the FinFET. The opening 165 that is formed by removing the sacrificial spacer 170 also exposes an upper surface of the pedestal of insulator material, i.e., the remaining portion of the insulating layer 120.

In some embodiments, the sacrificial spacer 170 may be removed by a selective etch process. The sacrificial spacer 170 may be removed using a wet or dry etch process. In one embodiment, the sacrificial spacer 170 is removed by reactive ion etch (RIE). In one example, the etch process for removing the sacrificial spacer 170 can include an etch chemistry for removing the sacrificial spacer 170 selective to the pedestal of the insulator material, i.e., the remaining portion of the insulator layer 120, the gate sidewall spacer 150, and the first epitaxial material 180.

The opening 165 that is formed by removing the sacrificial spacer 170 typically has the same dimensions as the sacrificial spacer 170. Therefore, the width W3 of the opening 165 may range from 3 nm to 30 nm. In another embodiment, the width of the opening 165 may range from 5 nm to 15 nm.

Referring to FIGS. 1A and 1B, a second epitaxial material layer 190 may be formed filling the opening 165 that is provided by removing of the sacrificial spacer 170. The second epitaxial material layer 190 is epitaxially grown (also referred to as epitaxially deposited) on, i.e., in direct contact with, a sidewall S2 of the at least one fin structure 130, as well as a sidewall S3 of the first epitaxial material layer 180 and an upper surface S4 of the first epitaxial material layer 180. The portion of the second epitaxial material layer 190 that is grown from the sidewall S2 of the at least one fin structure 130 and the sidewall S3 of the 180 of the first epitaxial material layer 180 is referred to as the vertical portion 192 of the second epitaxial material layer 190, which fills the opening 165 provided by removing the sacrificial spacer 170. Similar to the first epitaxial material layer 180, the second epitaxial material layer 190 is formed using an epitaxial growth process (also referred to as epitaxial deposition). The epitaxial growth process is selective for growing epitaxial material on semiconductor surfaces, such as the sidewall S2 of the at least one fin structure 130, and not growing epitaxial material on dielectric surfaces, such as the surface of the pedestal of insulator material, i.e., remaining portion of the insulator layer 120, that is present at the base of the opening 165. The portion of the second epitaxial material layer 190 that is formed on the upper surface S4 of the first epitaxial material layer 180 is referred to as the horizontal portion 191 of the second epitaxial material layer 190. The thickness of the horizontal portion 191 of the second epitaxial material layer 190 may range from 5 nm to 20 nm.

Typically, the first and second epitaxial material layers 180, 190 provide source and drain regions on opposing sides of the channel region portion of the at least one fin structure 130. The second epitaxial material layer 190 separates the first epitaxial material layer 180 from the sidewall S2 of the remaining portion of the at least one fin structure 130. The sidewall S2 of the remaining portion of the at least one fin structure 130 provides the interface I between the channel region of the FinFET and the source and drain regions of the FinFET. The material and conductivity type for the second epitaxial material layer 190 is typically the same as the material and conductivity type of the first epitaxial material layer 180. For example, when the FinFET has a p-type conductivity both the first and second epitaxial material layers 180, 190 may be composed of silicon germanium (SiGe) doped to a p-type conductivity, and when the FinFET has an n-type conductivity both the first and second epitaxial material layers 180, 190 may be composed of silicon doped with carbon (Si:C) doped to an n-type conductivity. Therefore, the above description of the materials, dopants and method of formation for the first epitaxial material layer 180 that is described above with reference to FIGS. 7A and 7B is suitable for the materials, dopants and method of formation for the second epitaxial material layer 190 that is depicted in FIGS. 1A and 1B.

In some embodiments, the methods and structures disclosed herein can eliminate the incidence of defects at the interface I of a channel region of a FinFET device and the epitaxial source and drain regions of the FinFET device by forming the epitaxial source and drain regions using at least two separately formed epitaxial material layers 180, 190. Typically, forming epitaxial source and drain regions in prior FinFET devices includes epitaxial growth on a sidewall of a channel region portion of the FinFET simultaneously with epitaxial growth on a recessed substrate surface directly adjacent to and intersecting with the sidewall of the channel region portion of the FinFET. In prior devices, it has been determined that the recessed substrate surface provides a rapid bottom up epitaxial growth, while the sidewall of the channel region portion provides a slower lateral epitaxial growth. The two epitaxial growth fronts in such close proximity results in the formation of defects at the interface of the channel region and the source and drain regions of the FinFET. In the present disclosure, the recessed substrate surface that provides for the rapid bottom up epitaxial growth directly adjacent to the sidewall of the channel region portion of the fin structure has been replaced with a dielectric surface, i.e., the pedestal of insulator material. This removes one of the growth fronts that have caused defect formation in prior FinFETs, because the epitaxial growth process for forming the second epitaxial material 190 will not form epitaxial material on a dielectric surface. In some embodiments, rapid bottom up epitaxial growth has been provided in the present method by the first epitaxial material 180 that is grown from an exposed surface Si of the at least one semiconductor layer 100, 110, e.g., the punch-through stopper layer 110, which is separated from the sidewall S2 of the channel region portion of the at least one fin structure 120. Following the formation of the first epitaxial material layer 180, the second epitaxial material 190 is laterally formed directly on the sidewall S2 of the at least one fin structure 130 that provides the channel region of the device. Bottom up growth of epitaxial material adjacent to the sidewall S2 of the at least one fin structure 130 during the formation of the second epitaxial material 190 is obstructed by the pedestal of dielectric material, i.e., remaining portion of the insulator layer 120. The unobstructed lateral growth of epitaxial semiconductor material for forming the second epitaxial semiconductor material 190 on the sidewall Si of the at least one fin structure 130 provides for a channel region interface I with the source and drain region structures that is free of defects, such as point defects, voids, stacking faults, line defects and dislocation defects.

FIGS. 1A and 1B also depict replacing the sacrificial gate structure 50 with a functional gate structure 160. In some embodiments, the sacrificial gate structure 50 may be removed by a selective etch process. The sacrificial gate structure 50 may be removed using a wet or dry etch process. In one embodiment, the sacrificial gate structure 50 is removed by reactive ion etch (RIE). In one example, the etch process for removing the sacrificial gate structure 50 can include an etch chemistry for removing the sacrificial gate structure 50 selective to at least one fin structure 130, the gate sidewall spacer 150, and the second epitaxial material 190.

A functional gate structure 160 may then be formed in the opening to the channel region of the device that is formed by removing the sacrificial gate structure 50. The function gate structure 160 typically includes at least one gate dielectric 135 and at least one gate conductor 140, wherein the at least one gate dielectric 135 is positioned between the at least one gate conductor 140 and the channel region of the FinFET. The at least one gate dielectric 135 may be formed by a thermal growth process such as, e.g., oxidation, nitridation or oxynitridation. The at least one gate dielectric 135 may also be formed by a deposition process, such as, e.g., chemical vapor deposition (CVD), plasma enhanced CVD (PECVD), metal organic CVD (MOCVD), atomic layer deposition (ALD), evaporation, reactive sputtering, chemical solution deposition and other like deposition processes. The at least one gate dielectric 135 may also be formed utilizing any combination of the above processes.

The at least one gate dielectric 135 may be comprised of a high-k gate dielectric having a dielectric constant that is greater than the dielectric constant of silicon oxide, e.g., about 4.0 or greater. In another embodiment, the at least one gate dielectric 135 is comprised of an insulating material having a dielectric constant greater than 7.0. The dielectric constants mentioned herein are relative to a vacuum. In one embodiment, the at least one gate dielectric 135 employed in the present disclosure includes, but is not limited to, an oxide, nitride, oxynitride and/or silicates including metal silicates, aluminates, titanates and nitrides. In one example, when the at least one gate dielectric 135 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric 135 may vary, but typically, the at least one gate dielectric 135 has a thickness from 1 nm to 10 nm. In another embodiment, the at least one gate dielectric 135 has a thickness from 1 nm to 3 nm.

After forming the material layer for the at least one gate dielectric 135, a conductive material which forms the at least one gate conductor 140 of functional gate structure 160 is formed on the at least one gate dielectric 135 utilizing a deposition process, such as physical vapor deposition (PVD), CVD or evaporation. The conductive material may comprise polysilicon, SiGe, a silicide, a metal or a metal-silicon-nitride such as Ta—Si—N. Examples of metals that can be used as the conductive material include, but are not limited to, Al, W, Cu, and Ti or other like conductive metals.

The conductive material may be doped or undoped. If doped, an in-situ doping deposition process may be employed. Alternatively, a doped conductive material can be formed by deposition, ion implantation and annealing.

It is noted that the above process sequence may include further preliminary, intermediate and finalizing steps that have not been described above.

In another embodiment, the process sequence for forming the finFET structure depicted in FIGS. 1A and 1B is formed using a gate first process sequence, which is not depicted in the supplied figures. The method depicted in FIGS. 1A-8B is a gate last process that includes replacing a sacrificial gate structure with a functional gate structure. In another embodiment, a functional gate structure is formed in the beginning of the process flow instead of a sacrificial gate structure, and the functional gate structure remains throughout the formation of the FinFET. This is referred to as a gate first process sequence. Both gate first and gate last process sequences are applicable to the present disclosure.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A structure comprising:
   a pedestal of an insulating material present over at least one layer of a semiconductor material that includes a punch through barrier layer;
   at least one fin structure in contact with the pedestal of the insulating material; and
   source and drain region structures on opposing sides of the at least one fin structure, at least one of the source and drain region structures comprising at least two epitaxial material layers, wherein a first epitaxial material layer of the at least two epitaxial layers is in contact with the punch through barrier layer of the at least one layer of semiconductor material, and a second epitaxial material layer of the at least two epitaxial layers is in contact with the at least one fin structure, the first epitaxial material layer being separated from the at least one fin structure by the second epitaxial material layer.

2. The structure according to claim 1 further comprising a gate structure present on the at least one fin structure.

3. The structure according to claim 1, wherein the at least one fin structure is a channel region, and an interface between the second epitaxial material layer of the source and drain region structures and the channel region is substantially free of defects.

4. The structure according to claim 1, wherein the at least one layer of semiconductor material further comprises a semiconductor substrate, wherein the punch through barrier layer is present between the pedestal of the insulating material and the semiconductor substrate.

5. The structure according to claim 4, wherein the punch through barrier layer is a doped portion of the substrate.

6. The structure according to claim 4, wherein the punch through barrier layer is doped to a conductivity type that is opposite a conductivity type of the source and drain region structures.

7. The structure according to claim 4, wherein the second epitaxial layer is in contact with the punch through barrier layer.

8. The structure according to claim 2, wherein a gate sidewall spacer is present on the gate structure, wherein a sidewall of the fin structure is aligned with an outer sidewall of the gate sidewall spacer, the first epitaxial material layer having a vertical portion in contact with the sidewall of the fin structure and a horizontal portion on an upper surface of the second epitaxial material layer.

9. The structure according to claim 7, wherein the first epitaxial material layer has a crystalline structure that is aligned with a crystalline structure of the punch-through layer, and the second epitaxial material layer has a crystalline structure that is aligned with a crystal structure of the sidewall of the at least one fin structure.

10. The structure according to claim 1, wherein the structure is a FinFET semiconductor device.

* * * * *